United States Patent [19]

Sedlmair

[11] 4,435,848

[45] Mar. 6, 1984

[54] STRIPLINE MICROWAVE BALANCED MIXER CIRCUIT

[75] Inventor: Siegfried Sedlmair, Groebenzell, Fed. Rep. of Germany

[73] Assignee: Siemens Aktiengesellschaft, Berlin & Munich, Fed. Rep. of Germany

[21] Appl. No.: 370,515

[22] Filed: Apr. 21, 1982

[30] Foreign Application Priority Data

Apr. 29, 1981 [DE] Fed. Rep. of Germany ....... 3117080

[51] Int. Cl.$^3$ .............................................. H04B 1/26
[52] U.S. Cl. ................................... 455/327; 455/330; 455/332; 333/26
[58] Field of Search ................................ 455/325–328, 455/333, 330, 332; 333/26, 238, 246, 247

[56] References Cited

U.S. PATENT DOCUMENTS 3,310,748 3/1967 Putnam .............................. 455/327
4,118,670 10/1978 Dickens ............................. 455/327

FOREIGN PATENT DOCUMENTS 56-69906 6/1981 Japan .................................. 455/327

*Primary Examiner*—Jin F. Ng
*Attorney, Agent, or Firm*—Hill, Van Santen, Steadman & Simpson

[57] ABSTRACT

A stripline tuning fork microwave balanced mixer circuit which includes two diodes (21, 22) and a differential transformer (61) whereby matching is accomplished in the differential transformer (61) and in the circuit arrangement between the differential amplifier and the diodes (21, 22) for matching the resistance to the input terminals (1, 2) and a transforming circuit (24, 25, 26) which suppresses the frequency range of the input signals following the diodes and has simultaneous high frequency blocking for matching to the intermediate frequency signal output at terminal (3). This latter circuit can be utilized so that it functions as a blocker for the sum frequencies of the two input signals and the balanced push-pull mixer circuit of the invention can be used in sensitive receivers used in the microwave range.

16 Claims, 4 Drawing Figures

4,435,848

STRIPLINE MICROWAVE BALANCED MIXER CIRCUIT

BACKGROUND OF THE INVENTION

1. Field of the Invention

This invention relates in general to a stripline microwave balanced mixer circuit for push-pull mixer circuits manufactured with stripline technology and comprises a differential transformer for applying two input voltages which are to be mixed and has two input terminals to which one of the input terminals is connected through two quarterwave length striplines to two transformer output terminals and the other input terminal is connected to the one transformer output terminal through the inner conductor of a coaxial line which has an arc-like shape and from the transformer extends to the output terminal. An arcuately shaped stripline with through contact to the ground plate is symmetrically disposed at the end and the outer conductor end is connected to the ground plate through a through contact and the other outer conductor end is connected to the other transformer output terminal. Two semiconductor diodes with one connected between one transformer output terminal and an intermediate frequency signal output and the other diode is connected between the other transformer output terminal and the intermediate frequency signal output. The diodes have opposite poling to the intermediate frequency signal output and components for blocking the frequency range of the two input voltages is also provided. Sometimes a problem exists for connecting a mixer which is to be operated with a noisy oscillator so as to prevent the mixer noise factor from becoming poor and which is to have low mixing losses then a balanced or push-pull mixer is utilized which functions with broadband high isolation between the two input terminals, i.e., between the oscillator branch and the input signal branch and also functions with matching for the two input signal terminals as well as for the intermediate frequency signal output to convert it for example to an intrinsic inpedance $Z_0$ of $50\Omega$.

SUMMARY OF THE INVENTION

The invention utilizes a not so well known tuning fork circuit for producing a balanced or push-pull mixer which contains a differential transformer for microwaves and which has the shape that appears like a tuning fork and allows a frequency independent high isolation between the two input signal terminals. In band width, it is superior to known circuits such as the 90° hybrid or the 180° hybrid. For example, the oscillator noise is greatly suppressed by the circuit of the invention even when the signal and the oscillator frequencies are greater spaced from each other.

According to the invention, a microwave balanced or push-pull mixer circuit is formed in stripline technology to match the intrinsic impedance $Z_0$ between the two input terminals and at the intermediate frequency signal terminal.

Two symmetrical striplines are mounted between the output terminals of the differential transformer and the diode terminals on the side away from the intermediate frequency signal output.

By enlarging the width of the stripline parallel capacitances are formed in the areas of the diode terminals.

The arc-shaped coaxial line and the stripline extending symmetrically relative thereto which extends from the two differential transformer output terminals are designed to be shorter than a quarter wave length so that parallel inductance is obtained.

The measures listed in the above three paragraphs are accomplished such that the diode impedances are respectively transformed at the differential transformer output terminals to the intrinsic impedance value $Z_0$. The width of two quarter wave lengths striplines is dimensioned such that a respective intrinsic impedance value of $Z_0 \cdot \sqrt{2}$ is obtained.

A stripline is inserted between the inner conductor end of the coaxial line on the side away from the differential transformer output terminals and the associated input terminal so that the overall length of the coaxial line and the stripline is equal to a quarter wave length and the intrinsic impedance of these two lines is equal to $Z_0 \cdot \sqrt{2}$. For blocking the frequency range of the input signals, a blocking circuit consisting of stripline arrangements and/or discrete components is inserted between the common diode terminal on the side facing the intermediate frequency signal output and the blocking circuit is dimensioned such that the impedance value $Z_0$ occurs at the intermediate frequency signal output at the desired intermediate frequency.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figures 1A, 1B:
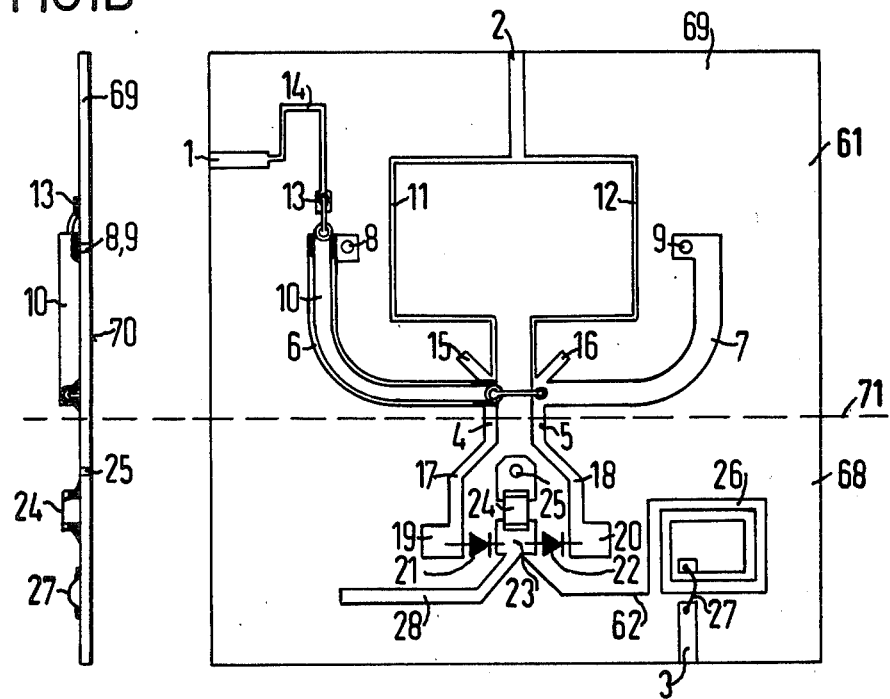
FIG. 1A is a plan view of the invention.
FIG. 1B is a side view of the invention.

FIG. 1A comprises a plan view of a first sample embodiment of a balance push-pull mixer according to the invention in stripline technology and FIG. 1B comprises a side view of the mixer. The stripline is formed on a substrate plate 69 and a grounded layer 70 of conductive material is formed on the second side of the substrate as illustrated in FIG. 1B and the device operates at a frequency of approximately 1GHz and at an intermediate frequency of approximately 60MHz. A differential transformer 61 is mounted on the plate 69 in an area above the broken line 71 in FIGS. 1A and 1B. The portion 68 below the broken line 71 converts and augments the differential transformer and produces a balanced push-pull mixer.

The differential transformer 61 has the job of conducting respective halves of an oscillator signal supplied at terminal 1 in opposite phase and an input signal supplied at terminal 2 in equi-phase to two terminals 4 and 5. With symmetrical wiring of the two terminals 4 and 5, the signals from terminals 1 and 2 are frequency independent and are decoupled. The equi-phase distribution occurs by means of the two striplines 11 and 12 which are approximately a quarter wave length long. The out of phase distribution is achieved with the assistance of a thin coaxial line 10 which is applied to a stripline 6 which is approximately a quarter wave length long and is short circuited to the ground plate 70 at one end by means of a through contact 8 of the outer conductor. The outer conductor of the coaxial line 10 terminates at the terminal 4 and the inner conductor of the coaxial line 10 terminates at the terminal 5 which for balancing circuits connects to stripline 7 with a through contact 9 to the ground plate 70. At every external location, the coaxial line 10 is equal potential with the stripline 6 but is only electrically and mechanically connected, for example, by means of soldering to the stripline 6 at its ends in an advantageous manner. Differences of thermal expansion between the coaxial line 10 and the stripline 6 do not result in mechanical stresses which are too large due to the curve form of the lines. The diameter of the coaxial line 10 is at the most equal to the width of the strip line 6 when a decoupling of approximately 30 decibels is to be achieved without correcting measures. Broader coaxial lines 10 reduce the intrinsic impedance of the line with the stripline 6 so that in order to obtain symmetry the line with stripline 7 must receive the same intrinsic impedance, in other words, must be broadened. It suffices for circuit balance however, to provide a parallel capacitance at terminal 5 and balance capacitor can be realized by means of a stripline length 16 at the terminal 5 which is made larger in area than a balance capacitor which is formed by stripline length 15 which extends from terminal 4.

A matching circuit is inserted between two semiconductor diodes 21 and 22 and the differential transformer 61 with the matching circuit assuring that the two input signal levels, in other words, both the oscillator level supplied to terminal 1 as well as the signal level supplied to terminal 2 are efficiently utilized.

The impedance of the two diodes 21 and 22 is transformed to the resistance $Z_0$ by means of parallel capacitors 19 and 20 as well as striplines 17 and 18 and parallel inductances at the terminals 4 and 5. The resistance $Z_0$ is the resistance which is to exist at the input terminals 1 and 2 as well as an intermediate frequency signal output terminal 3 and which equals for example $50\Omega$. The two parallel capacitors 19 and 20 are formed by enlarging the stripline widths at the terminal locations of the two diodes 21 and 22 as shown in the drawing. The parallel inductance is formed in that the two striplines 6 and 7 of the differential transformer 61 are shorter than a quarter wave length. This type of matching produces a low space requirement which is very advantageous particularly at the relatively low microwave frequencies such as, for instance, 1GHz.

The differential transformer 61 thus becomes a part of the matching circuit. Its lines formed from the two striplines 6 and 7 also represent the DC return path required for the two mixer diodes 21 and 22.

The further matching within the differential tramsformer 61 at the external signal terminal to the intrinsic impedance $Z_0$ of, for example, $50\Omega$ results in a manner such that the two quarter wave lengths lines with striplines 11 or respectively 12 are executed with an intrinsic impedance of $Z_0.\sqrt{2}$.

The connected load for the coaxial line 10 between the two terminals 4 and 5 is $2.Z_0$ which would be in the example $100\Omega$. This load is transformed to the resistance $Z_0$ after the impedance terminal 1 being transformed through a line transformer which is a quarter wave length long and also exhibits an intrinsic impedance of $Z_0.\sqrt{2}$. The quarter wave length long transformer consists of two line pieces since the length of the coaxial line 10 is expediently only as long as the stripline 6. A stripline 14 which is connected at a junction 13 to the inner conductor of the coaxial line 10 completes the overall line length. In other words, the sum of the coaxial line 10 and the stripline 14 equals one quarter wave length. The stripline 14 also has an intrinsic impedance of $Z_0.\sqrt{2}$. Semi-rigid cable can be utilized as the coaxial line 10.

The arrrangement illustrated in FIGS. 1A and 1B has a particularly high frequency blocking between the mixer diodes 21 and 22 and the intermediate frequency signal output 3. Matching to the resistance $Z_0$ should also exist at intermediate frequency signal output 3 in the same manner as at the signal output terminals 1 and 2. The capacity value of a blocking capacitor 24 is selected such that together with the inductance of an integrated stripline coil 26 matching to the resistance $Z_0$ is produced at the intermediate frequency signal output 3 utilizing a desired intermediate frequency of, for example, 60 MHz. This simple type of matching although not being very broad band is sufficient for many applications.

It is possible to produce broad band circuits using four reactance elements. The high frequency blocking is made highly effective in that the series resonance which is already present which is obtained from the blocking capacitor 24 and its feed inductance including the inductance of a through contact 25 to ground is placed in the area of the signal or respectively oscillator frequency. This can be accomplished for example, in that the distance between the common diode terminal point 23 and the through contact location 25 is suitably selected. The stripline coil 26 is connected on one side to the common diode point 23 over a narrow stripline 62 and is connected at the other side to the intermediate frequency signal output 3 over a wire bridge 27.

An advantageous measure which leads to low mixing losses can be produced by creating a high frequency short circuit at the diode interconnection point 23 for the sum frequency of the two input signals. This is achieved by using a quarter wave length long stripline 28 for the sum frequency which is under no load operation at this point. At the intermediate frequency the capacitance of the line with the stripline 28 switches parallel to the blocking capacitance 24.

Figure 2:
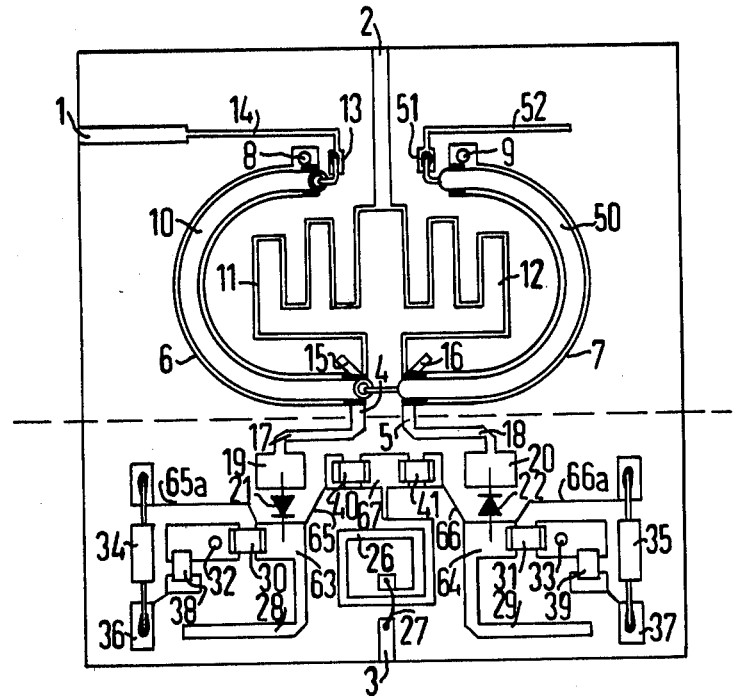
FIG. 2 illustrates a plan view of a modification of the invention.

FIG. 2 is an enlarged plan view illustrating a second embodiment of a stripline balance push-pull mixer according to the invention. Somewhat different execution of the diode portion allows the oscillator voltage rectified by the mixer diodes 21 and 22 to be conducted out for check purposes or allows a bias voltage to be supplied. The high frequency blocking occurs over the two blocking capacitors 30 and 31 which relative to the input signal frequencies, for example, are mounted in series resonance with the inductances of the two through contacts 32 and 33. The short circuit for the sum frequency of the two input voltages supplied to the input terminals 1 and 2 results due to the two no load striplines 28 and 29. The DC component after the diodes 21 and 22 arrives through two chokes 34 and 35 at the two terminal points 36 and 37. These two terminal points 36 and 37 are respectively connected to ground through the two resistors 38 and 39 at through contacts 32 and 33 so as to terminate the DC path for the diodes 21 and 22 when no low resistance external wiring occurs. The intermediate frequency signal is supplied to the intermediate frequency signal output 3 over two separating capacitors 40 or 41 and an integrated stripline coil 26 as well as over a wire bridge 27. The transformation of the intermediate frequency internal resistance to the value $Z_0$ (for example 50Ω) results in a manner similar to that in the sample embodiment according to FIG. 1 with two blocking capacitors 30 and 31 as parallel capacitors and the coil 26 as a series inductance. The chokes 34 and 35 are high impedance for the intermediate frequency and practically have no significance. The inner connection location of the two separating capacitors 40 and 41 which forms one terminal of the stripline 26 is designated by reference 67. The separating capacitors 40 and 41 are respectively connected to the chokes 34 and 35 with the two striplines 65, 65a and respectively, 66 and 66a whereby terminal location 63 and 64 is provided for the diodes 21 and 22 in the path of the striplines 65, 65a or, respectively, 66 and 66a. The no-load striplines 28 and 29 and the blocking capacitors 30 and 31 extend from terminals 63 and 64, respectively.

The part of the differential transformer of the sample embodiment according to FIG. 2 lying above the broken line is provided with two semi-circular coaxial lines 10 and 50 which are mounted over striplines 6 and 7. The outer conductor ends of the coaxial lines 10 and 50 are electrically and mechanically connected for example by soldering to the ends of the two striplines 6 and 7, respectively. By means of special shaping and mounting of the coaxial lines 10 and 50 mechanical stresses are practically entirely suppressed. The coaxial line 50 on the stripline 7 was not utilized in the FIG. 1 embodiment but it produces the advantage of an even greater band width for the matching of the input signal terminal 1. The coaxial line 50 is produced to be approximately one quarter wave length using the stripline attached to its inner conductor at the junction 51. Therefore, the no-load at the end of the line with the stripline 52 is transformed at the center frequency into a short circuit at the input of the coaxial line 50 at the terminal 5. In other words, the inner conductor of the coaxial line 10 is connected to terminal 5. The inner conductors of the two coaxial lines 10 and 50 are electrically connected together. At frequencies which vary from the center frequency and at which the lines with the striplines 6 and 7 vary from the desired for example inductive reactive impedance, a reactive impedance which has a value can be set with the intrinsic impedance of the coaxial line 50 which resists the deviation that appears at the input of the coaxial line 50 at the terminal location 5.

The respective one quarter wave length long striplines 11 and 12 between the input signal 2 and the terminals 4 or 5 are partially formed so that they meander as illustrated in FIG. 2. The remaining portions of the example of FIG. 2 coincide with that illustrated in FIG. 1.

The precondition for the diode circuits illustrated in FIGS. 1 and 2 is that for high frequency blocking after the mixer diodes 21 and 22 is possible due to the concentrated capacitors 24, or respectively 30 and 31, utilizing series resonance. At operating frequencies above 3 GHz this will not occur without further measures. Therefore, capacitive stripline patches can be employed, for example. Quarter wave length line pieces which for instance produce a short circuit at the mixer diode 21 and 22 at the operating frequency can also be utilized.

Figure 3:
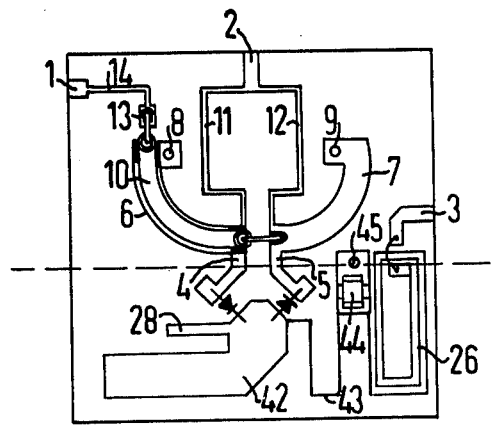
FIG. 3 illustrates a further modification of the invention.

FIG. 3 illustrates an example of such a circuit. Here a bent down quarter wave length low resistance stripline 42 accomplishes the blocking. A no-load stripline 28 additionally short circuits the sum frequency of the input signals. Since, however, the capacitance of the two lines 28 and 42 would usually probably not suffice to enable the required transformation of the intermediate frequency internal resistance to the value $Z_0$ for example 50Ω together with the series inductance of the stripline coil 26 an auxiliary capacitor in the form of a discrete capacitor which is through connected to ground at location 45 is provided in the embodiment illustrated in FIG. 3. For the purpose of decoupling from the blocking a high resistance approximately one quarter wavelength stripline 43 is additionally inserted. The remaining portion of the push-pull amplifier illustrated in FIG. 3 corresponds to the example illustrated in FIG. 1.

It is seen that the various components which have been described herein are clearly illustrated in FIGS. 1A 1B, 2 and 3 and the shape and arrangement of the various striplines capacitors, coils and other components are generally as illustrated. It is to be realized that minor modifications of the arrangements can be made and still would be within the scope of the present invention which is defined by the appended claims.

I claim as my invention:

1. A microwave balanced or push-pull mixer circuit for an operating frequency formed in stripline technology having first and second input terminals and an intermediate frequency signal terminal each having an impedance $Z_0$ comprising, a differential transformer which for applying two input voltages to be mixed through said first and second input terminals with said first one connected through two quarter wave length striplines to first and second transformer output terminals and said second input terminal connected to said second transformer output terminal through the inner conductor of an arcuate-shaped coaxial line, an arcuate-shaped stripline connected to the second transformer output terminal and with one end connected by a through-contact to a ground plate, and the other outer end connected to the first transformer output terminal, first and second semi-conductor diodes connected together with a common terminal, with said first one mounted between the first transformer output terminal and an intermediate frequency signal output terminal and said second diode mounted between the second transformer output terminal and the intermediate frequency signal output terminal and poled differently than said first diode relative to the intermediate frequency signal output, means for blocking the frequency range of the two input voltages connected ahead of said diodes and for matching to the impedance $Z_0$, two symmetrical striplines (17, 18) connected between said first and second transformer output terminals (4, 5) and the non-common terminals (19, 20) of said first and second diodes, and said striplines being enlarged near the noncommon terminals so that parallel capacitances are formed in the area of said diode terminals (19, 20), and the arcuate-shaped coaxial line (10) and the stripline (7) extending symmetrically relative thereto and which extend from said first and second differential transformer output terminals (4, 5) are designed to be shorter than a quarter wave length at the operating frequency so that parallel inductances are formed, and tuned such that the impedances of said first and second diodes at the differential transformer output terminals (4, 5) are respectively transformed to the impedance $Z_0$, the width of said two quarter wave length striplines (11, 12) is selected such that they have an impedance of $Z_0 \cdot \sqrt{2}$, another stripline (14) mounted between said inner conductor (13) of the coaxial line (10) on the end away from the differential transformer output terminals (4, 5) and the second input terminal (1), so that the overall length of the coaxial line (10) and of said another strip-line (14) equals a quarter wave length and the impedance of these two lines is equal to $Z_0 \cdot \sqrt{2}$, and blocking the frequency range of the two input signals, a blocking circuit composed of a stripline coil (26) mounted between said common diode terminal (23) adjacent the intermediate frequency signal output terminal (3), said blocking circuit selected such that, at the desired intermediate frequency, the impedance $Z_0$ occurs at the intermediate frequency signal output terminal (3).

2. A microwave balanced or push-pull mixer circuit according to claim 1, characterized in that the coaxial line (10) is mounted over a stripline (6) and the two outer conductor ends of said coaxial line (10) are electrically and mechanically connected to the ends of said stripline.

3. A microwave balanced or push-pull mixer circuit according to claim 2, characterized in that the diameter of said coaxial line (10) is not greater than the width of the stripline (6) lying thereunder.

4. A microwave balanced or push-pull mixer circuit according to claim 2, characterized in that with a coaxial line (10) which has a diameter which exceeds the width of the stripline (6) mounted thereunder, the stripline (7) extends symmetrically relative thereto and is wider for intrinsic impedance balancing.

5. A microwave balanced or push-pull mixer circuit according to claim 2 characterized in that a pair of small stripline pieces (15, 16) extend from the two differential transformer terminals (4, 5), said stripline pieces (15, 16) forming parallel capacitances and dimensioned in lengths such that an intrinsic impedance balance of the two geometrically, symmetrically and arcuately proceeding lines (10, 7) occurs.

6. A microwave balanced or push-pull mixer circuit according to claim 1 characterized in that said stripline coil comprising a helical, integrated stripline coil (26) is mounted between the common diode terminal (23) and said intermediate frequency signal terminal (3), and a blocking capacitor (24) which is through-contacted to ground at its other end (25) is connected to said common diode terminal (23), and the blocking capacitor (24) having a feed line with inductance which with capacitance of said blocking capacitor is resonant at the operating frequency.

7. A microwave balanced or push-pull mixer circuit according to claim 6, characterized in that the distance between the common diode terminal (23) and the through-contact location (25) is suitably selected for obtaining the feed inductance and at the desired series resonance frequency.

8. A microwave balanced or push-pull mixer circuit according to claim 1 characterized in that a stripline (28) which has no-load at its end extends from said common diode terminal (23) said stripline (28) having a length of ¼ of a wave length which corresponds to the frequency of the sum of the two input voltages.

9. A microwave balanced or push-pull mixer circuit according to claim 1 characterized in that a separating capacitor (40, 41) is connected in series by means of a stripline train (65, 66) to each of said first and second diodes (21, 22) in the direction toward the intermediate frequency signal output terminal (3), and a respective line train (65a, 66a) extends to two external terminal locations (36, 37) located between diodes (21, 22) and separating capacitors (40, 41) (FIG. 2).

10. A microwave balanced or push-pull mixer circuit according to claim 9, characterized in that chokes (34, 35) are mounted in series in each of the two line trains (65a, 66a) extending to the external terminal locations (36, 37) (FIG. 2).

11. A microwave balanced or push-pull mixer circuit according to claim 9 characterized in that blocking capacitors (30, 31) and resistors (38, 39) are mounted in series parallel to each of the two line trains (65a, 66a), and through-contacts (32, 33) extend to the ground plane at ends thereof, an inductance formed as a helical integrated stripline coil (26) is mounted between the circuit location (67) which is mounted between the two separating capacitors (40, 41) and the intermediate frequency signal output terminal (3).

12. A microwave balanced or push-pull mixer circuit according to claim 9 characterized in that respective striplines (28, 29) which has no-load at their ends extend from the junction points (63, 64) between said diodes (21, 22) and separating capacitors (40, 41), said striplines (28, 29) having lengths of ¼ of the wave length which corresponds to the sum frequency of the two input voltages (FIG. 2).

13. A microwave balanced or push-pull mixer circuit according to claim 9 characterized in that a second coaxial line (50) is mounted over the stripline (7) of the differential transformer (61) and extends symmetrically relative to the coaxial line (10) with one inner conductor end of said second coaxial line (50) connected to the inner conductor of said first coaxial line (10) and a no-load stripline (52) attached to the other inner conductor end (51) of said second coaxial line (50) so that the overall length of the second coaxial line (50) and the stripline (52) attached thereto is approximately ¼ wave length at the frequency of the input voltages (FIG. 2).

14. A microwave balanced or push-pull mixer circuit according to claim 13, characterized in that said second coaxial line (50) is electrically and mechanically connected at its two outer conductor ends to the stripline (7) lying thereunder.

15. A microwave balanced or push-pull mixer circuit according to claim 13 characterized in that the two coaxial lines (10, 50) are respectively mounted in a semicircular arc-shape.

16. A microwave balanced or push-pull mixer circuit according to claim 1 characterized in that the input voltage which is supplied to the stripline (14) leading to the first coaxial line (10) is an oscillator signal and the input voltage which is supplied at the input terminal (2) connected to the two quarter wave length striplines (11, 12) is a high frequency input signal which is to be heterodyned to a lower frequency.

* * * * *